(12) United States Patent
Wu et al.

(10) Patent No.: US 6,727,732 B1
(45) Date of Patent: Apr. 27, 2004

(54) HIGH SPEED DIFFERENTIAL SIGNAL DETECTION

(75) Inventors: Bin Wu, San Jose, CA (US); Manoj N. Rana, Union City, CA (US)

(73) Assignee: BitBlitz Communications, Inc., Milpitas, CA (US)

( * ) Notice: Subject to any disclaimer, the term of this patent is extended or adjusted under 35 U.S.C. 154(b) by 30 days.

(21) Appl. No.: 10/246,982

(22) Filed: Sep. 18, 2002

(51) Int. Cl.⁷ ................................................. H03K 5/22
(52) U.S. Cl. .......................................... 327/65; 327/66
(58) Field of Search ..................... 327/108–112, 63–67, 327/89, 170

(56) References Cited

U.S. PATENT DOCUMENTS 6,504,405 B1 * 1/2003 Nguyen et al. ............... 327/67

* cited by examiner

Primary Examiner—Kenneth B. Wells
(74) Attorney, Agent, or Firm—Edward C. Kwok; MacPherson Kwok Chen & Heid LLP

(57) ABSTRACT

A method and a circuit detect the presence of a high-speed signal, such as a high-speed differential signal, based on a software-programmable signal amplitude threshold. In one embodiment, when the amplitude threshold is exceeded, a current is generated to charge a capacitor. The voltage on the capacitor is compared to a second pre-set voltage in a low-speed comparator, which provides an output voltage indicating detection of the high-speed signal.

12 Claims, 3 Drawing Sheets

HIGH SPEED DIFFERENTIAL SIGNAL DETECTION

BACKGROUND

The present invention relates to circuits and methods for detecting high-speed signals.

SUMMARY

The present invention provides a method and a circuit that detect the presence of a high-speed signal, such as a high-speed differential signal, based on a software-programmable signal amplitude threshold. In one embodiment, when the amplitude threshold is exceeded, a current is generated to charge a capacitor. The voltage on the capacitor is compared to a second pre-set voltage in a low-speed comparator, which provides an output voltage indicating detection of the high-speed signal. In one embodiment, a high-speed differential signal operating at 3.125 Gbits per second can be detected.

According to one embodiment of the present invention, a high-speed signal detection circuit includes a capacitor, and a detection circuit receiving a high-speed signal and a threshold voltage. The detection circuit charges the capacitor when the high-speed signal has an amplitude exceeding the threshold voltage by a predetermined amount. In one embodiment, the high-speed signal detection circuit further includes a comparator receiving a reference voltage and coupled to the capacitor. The comparator provides an output signal having two binary states, the output signal transitioning between the binary states when a voltage on the capacitor exceeds the reference voltage. The high-speed signal can be a differential signal.

In one embodiment of the present invention, the high-speed signal detection circuit includes first and second transistors each having a source terminal and a drain terminal being coupled respectively to a terminal of the capacitor and a predetermined voltage, and a gate terminal coupled to one end of the differential signal.

In one embodiment of the present invention, the high-speed signal detection circuit generates the reference voltage by tapping a string of resistors.

In one embodiment of the present invention, the high-speed signal detection circuit generates a second reference voltage from the string of resistors. The reference voltage is selected by activating one of a number of switches, each switch being coupled to receive one of the first and second reference signals. In one implementation, the switches can be made software programmable.

The present invention is better understood upon consideration of the detailed description below and the accompanying drawings.

DETAILED DESCRIPTION OF THE PREFERRED EMBODIMENTS

The present invention provides a method and a circuit that detects the presence of a high-speed differential signal, based on a software programmable signal amplitude threshold.

Figure 1:
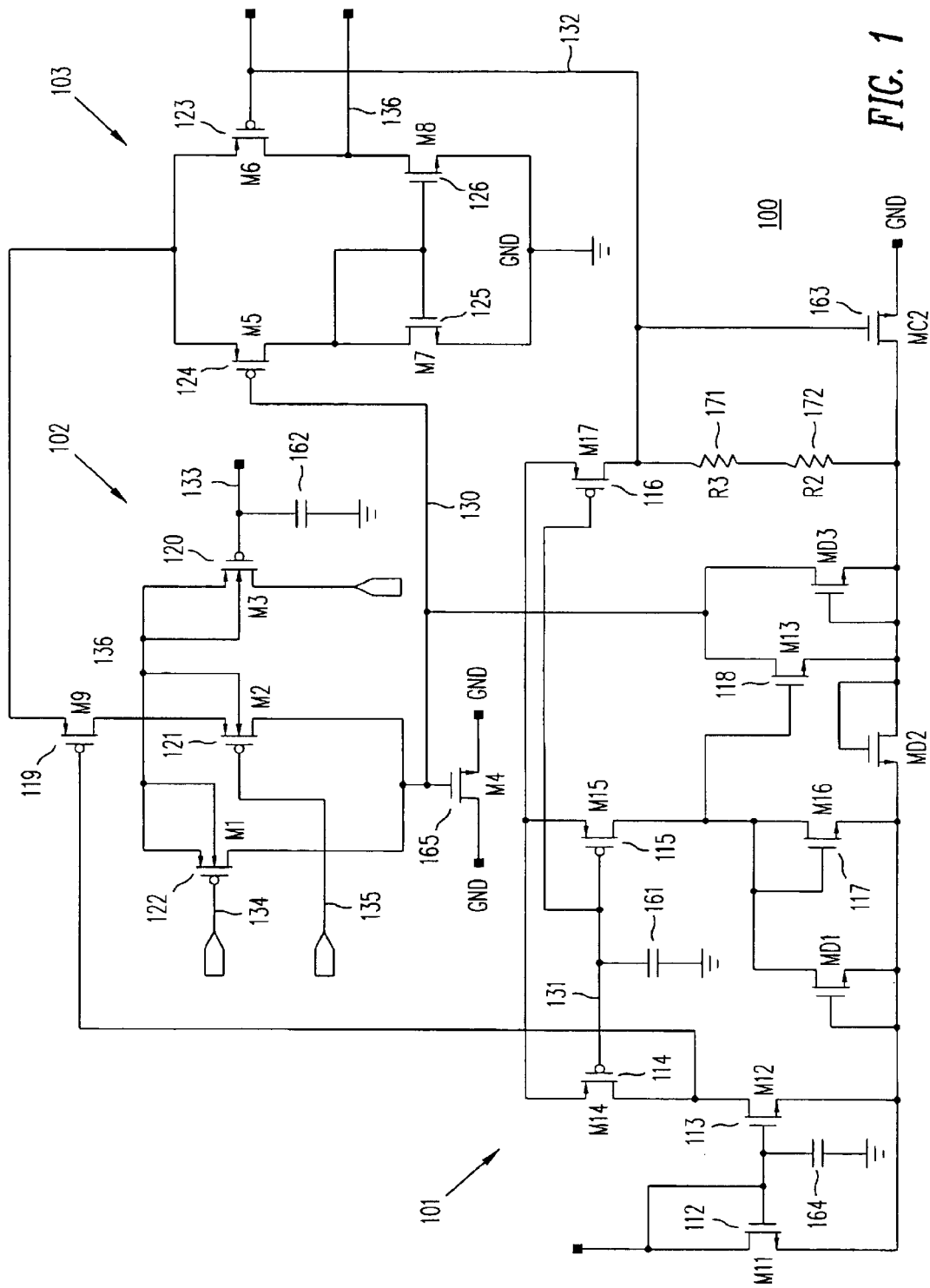
FIG. 1 shows signal detector circuit 100, according to one embodiment of the present invention.

One embodiment of the present invention is shown in FIG. 1. As shown in FIG. 1, signal detector circuit 100 includes bias generation circuit 101, detection circuit 102, and comparator circuit 103. Bias generation circuit 101 includes NMOS transistor 112, which receives a voltage $V_{bias}$ at its gate and drain terminals. Voltage $V_{bias}$ is selected such that NMOS transistor 112 acts as a current source that provides a current of 100 micro-Amp (uA). The current in NMOS transistor 112 is mirrored in NMOS transistor 113 and PMOS transistor 114. The width of NMOS transistor 113 is selected to be ⅕ of the width of NMOS transistor 112, such that the current in transistors 113 and 114 is 20 uA. This current in PMOS transistor 114 is, in turn, mirrored in PMOS transistors 115 and 116. PMOS transistors 115 and 116 are sized to apt as 10 uA and 100 uA current sources, respectively. The current in NMOS transistor 117, i.e., the 10 uA current in PMOS transistor 115, is mirrored in NMOS transistor 118. The relative sizes of NMOS transistors 117 and 118 result in 2 uA current being drawn from output node 130 of detection circuit 102.

In bias generation circuit 101, the voltage ("$V_{p\text{-}bias}$") at gate terminal 131 of PMOS transistor 114 is provided to the gate terminal of PMOS transistor 119 of detection circuit 102. The relative sizes of PMOS transistors 114 and 119 provide a 100 uA current in PMOS transistor 119. The 100 uA current in PMOS transistor 116 flows in 2 KΩ resistors 171 and 172, so that a reference voltage of 400 millivolts (mV) is provided at gate terminal 132 of PMOS transistor 123 in comparator 103. Capacitors 161, 162, 163 and 164 are MOS capacitors provided as filtering capacitors.

Referring now to detection circuit 102. In detection circuit 102, a programmable voltage $V_x$ is provided at gate terminal 133 of PMOS transistor 120. Programmable voltage $V_x$ is provided by programmable voltage generation circuit 200 of FIG. 2, described in further detail below. PMOS transistor 121 and 122, each ¹⁄₁₀ the size of PMOS transistor 120 in this embodiment, receive a differential input signal $V_{inp}$ and $V_{inn}$ at their respective gate terminals 134 and 135. When there is no signal across gate terminals 134 and 135, the common mode voltage in differential signal $V_{inp}$ and $V_{inn}$ is set to 500 mV. At this common mode voltage, PMOS transistors 121 and 122 are not conducting, and since a 2 uA current is drawn from output node 130 of detection circuit 102, MOS capacitor 165 is discharged, so that the voltage at output node 130 is substantially at ground. The voltage $V_{xx}$ at terminal 139 is thus given by:

$$V_{xx}=V_{d\text{-}sat}+V_{tp}+V_x \quad (1)$$

Where voltage $V_{d\text{-}sat}$ is the overdrive voltage at the drain terminal of transistor 120, $V_{tp}$ is the threshold voltage of a PMOS transistor and $V_x$ is the programmable voltage received from voltage generation circuit 200. Thus, when voltage $V_{xx}$ exceeds source-to-gate voltage $V_{sg}$ of either PMOS transistors 121 and 122 by PMOS threshold voltage $V_{tp}$ (i.e., either inequality $V_{xx}-V_{inp}>V_{tp}$ or inequality $V_{xx}-V_{inn}>V_{tp}$ holds), the corresponding one of PMOS transistors 121 and 122 conducts, thereby charging MOS capacitor 165. Substituting equation (1) into either inequality, we obtain:

$$V_{d\text{-}sat}+V_x>V_{inp} \quad (2)$$

$$V_{d\text{-}sat}+V_x>V_{inn} \quad (3)$$

Figure 3:
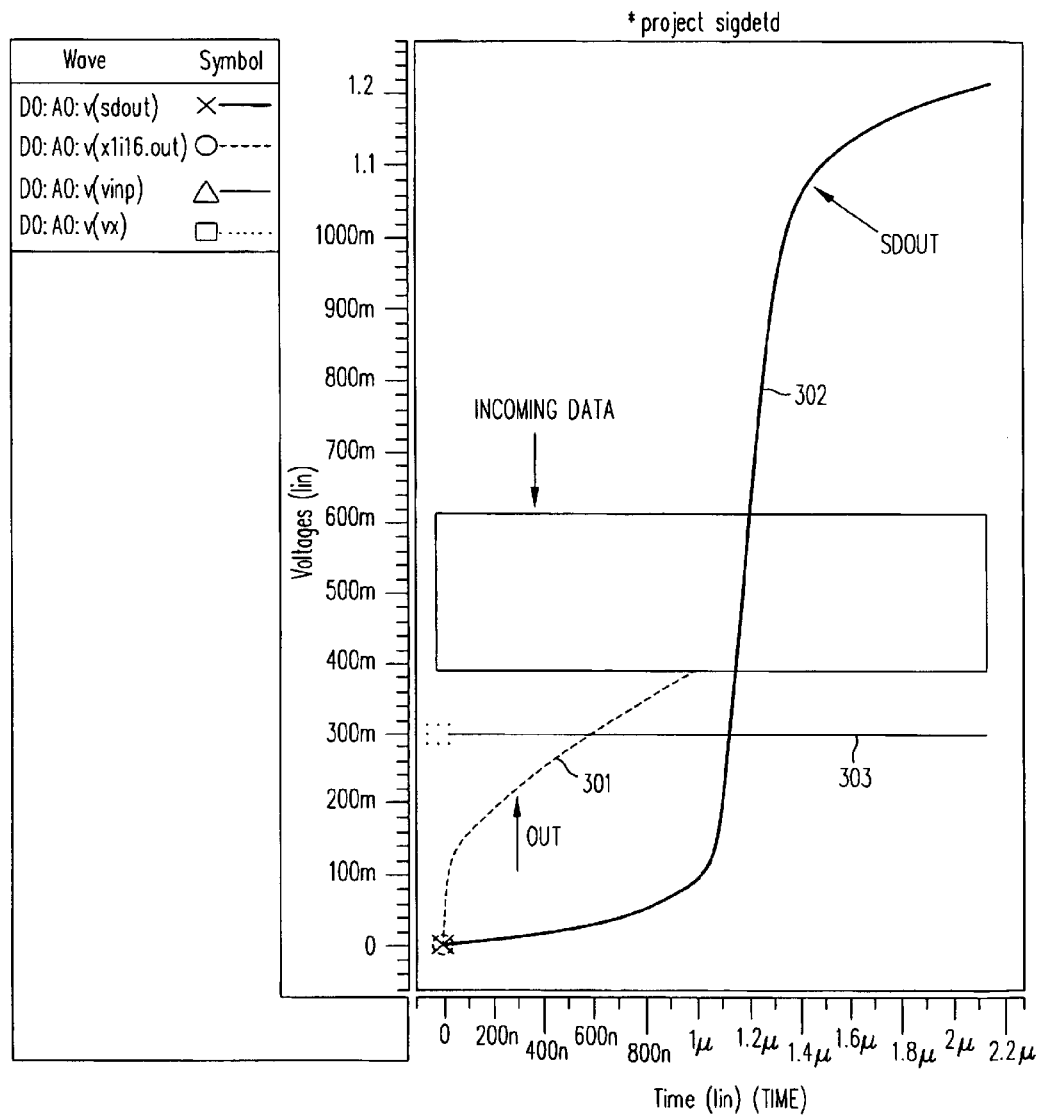
FIG. 3 shows the time-dependent voltage curves at terminals 130 and 136 in response to incoming data received at the differential signal across terminals 134 and 135.

That is, the signal levels at which incoming data is deemed received are determined by appropriately setting voltage $V_x$. The charging current due to conduction in PMOS transistors 121 and 122 exceeds the 2 uA current of PMOS transistor 118. Consequently, the voltage in terminal 130 of MOS capacitor 165 rises, which is amplified by comparator 103 to provide a corresponding rising output voltage at terminal 136. FIG. 3 shows the time-dependent voltage curves 301 and 302 at terminals 130 and 136, respectively, in response to incoming data received at the differential signal across terminals 134 and 135. As shown in FIG. 3, the output voltage at terminal 136 of comparator 103 rapidly rises from zero volts to approximately 1 volt after 1 microsecond (us) of data activity. This rapid rise in voltage indicates detection of the high-speed differential signal. In one implementation, the differential signal at terminals 134 and 135 are received from the receiver pins of a 3.125 GHz high-speed transceiver integrated circuit.

Figure 2:
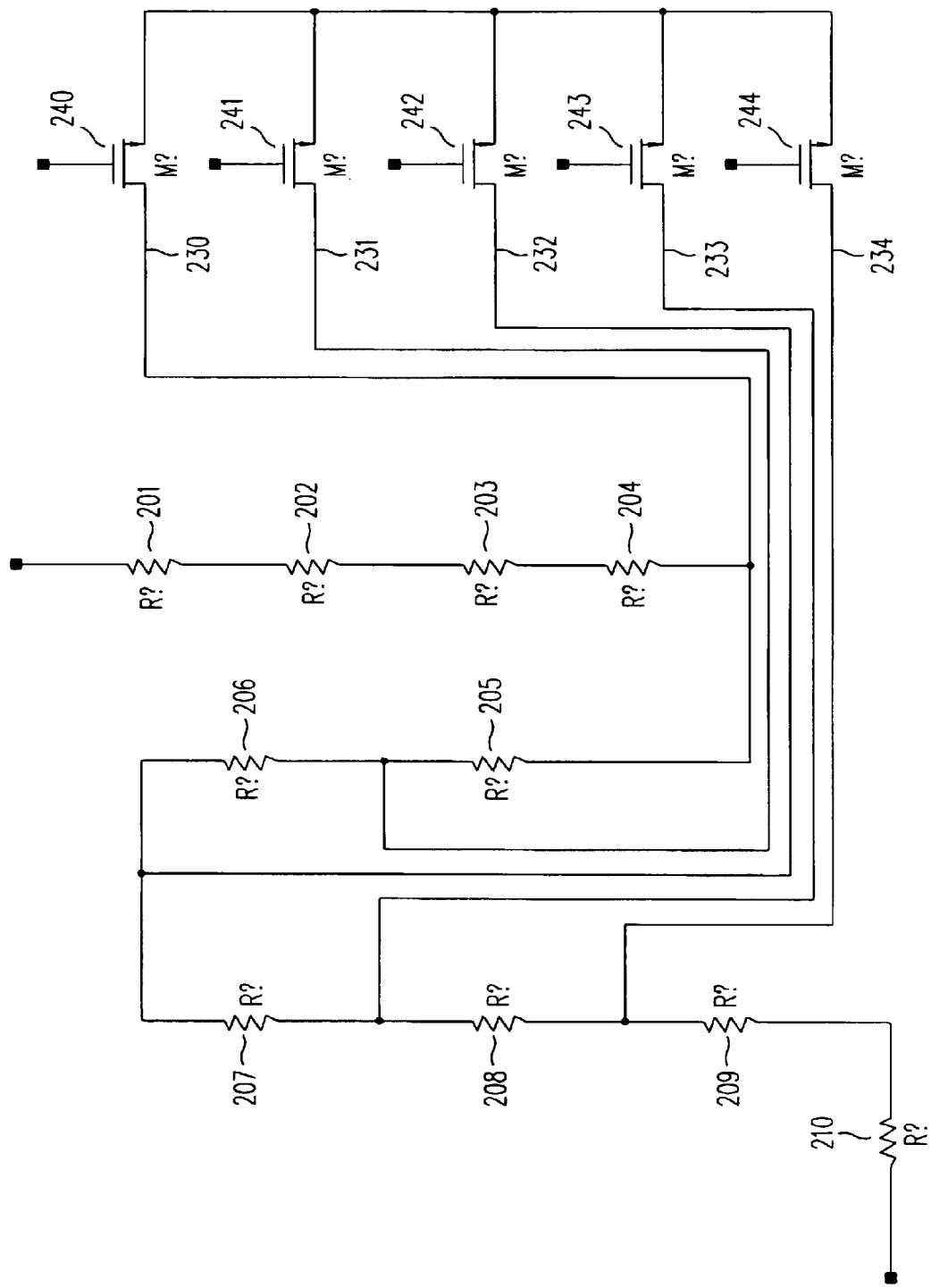
FIG. 2 shows generating a programmable voltage $V_x$ in programmable voltage generation circuit 200.

FIG. 2 shows generating a programmable voltage $V_x$ for terminal 133 in programmable voltage generation circuit 200. As shown in FIG. 2, serially connected resistors 201 to 210 provide predetermined voltages between 274 mV to 354 mV at 20 mV intervals at terminals 230–234, respectively, which can be individually selected by pass transistors 240–244 as the bias voltage at terminal 133 of FIG. 1.

The above detailed description is provided to illustrate specific embodiments of the present invention and is not intended to be limiting. Numerous variations and modifications within the scope of the present invention are possible. The present invention is set forth in the following claims.

We claim:

1. A differential signal detection circuit, comprising:
   a capacitor; and
   a detection circuit receiving (a) a differential signal comprising a first component signal and a second component signal, and (b) a threshold voltage, said detection circuit charging said capacitor when one of said component signals of said differential signal has an amplitude exceeding said threshold voltage by a predetermined amount.

2. A differential signal detection circuit as in claim 1, further comprising a comparator receiving a reference voltage and coupled to said capacitor, said comparator providing an output signal having two binary states, said output signal transitioning between said binary states when a voltage on said capacitor exceeds said reference voltage.

3. A differential signal detection circuit as in claim 1, wherein said detection circuit comprises first and second transistors each having a source terminal and a drain terminal being coupled respectively to a terminal of said capacitor and a predetermined voltage, and a gate terminal coupled to one of said component signals of said differential signal.

4. A differential signal detection circuit as in claim 2, wherein said reference voltage is generated by tapping a string of resistors.

5. A differential signal detection circuit as in claim 4, wherein a second reference voltage is generated from said string of resistors, said reference voltage being selected by activating one of a plurality of switches.

6. A differential signal detection circuit as in claim 5, wherein said switches are software programmable.

7. A method for detecting a differential signal, comprising:
   receiving a differential signal comprising a first component signal and a second component signal;
   receiving a threshold voltage; and
   charging a capacitor when one of said component signals of said signal has an amplitude exceeding said threshold voltage by a predetermined amount.

8. A method for detecting said differential signal as in claim 7, further comprising receiving a reference voltage and receiving a voltage of said capacitor; and providing an output signal having two binary states, said output signal transitioning between said binary states when said voltage on said capacitor exceeds said reference voltage.

9. A method for detecting a differential signal as in claim 7, further comprising providing first and second transistors each having a source terminal and a drain terminal being coupled respectively to a terminal of said capacitor and a predetermined voltage, and a gate terminal coupled to one of said component signals of said differential signal.

10. A method for detecting a differential signal as in claim 8, further comprising generating said reference voltage by tapping a string of resistors.

11. A method for detecting a differential signal as in claim 10, further comprising generating a second reference voltage from said string of resistors, said reference voltage being selected by activating one of a plurality of switches.

12. A method for detecting a differential signal as in claim 11, further comprising programming said switches by software.

* * * * *